(12) United States Patent
Harnett

(10) Patent No.: US 12,476,181 B2
(45) Date of Patent: Nov. 18, 2025

(54) ELECTRICAL CONTACT ARRAY FOR HARVESTING POWER FROM A POWER CIRCUIT

(71) Applicant: UNIVERSITY OF LOUISVILLE RESEARCH FOUNDATION, INC., Louisville, KY (US)

(72) Inventor: Cindy Harnett, Louisville, KY (US)

(73) Assignee: University of Louisville Research Foundation, Inc., Louisville, KY (US)

(*) Notice: Subject to any disclaimer, the term of this patent is extended or adjusted under 35 U.S.C. 154(b) by 783 days.

(21) Appl. No.: 17/052,608

(22) PCT Filed: May 2, 2019

(86) PCT No.: PCT/US2019/030453
§ 371 (c)(1),
(2) Date: Nov. 3, 2020

(87) PCT Pub. No.: WO2019/213431
PCT Pub. Date: Nov. 7, 2019

(65) Prior Publication Data
US 2021/0233840 A1 Jul. 29, 2021

Related U.S. Application Data

(60) Provisional application No. 62/666,166, filed on May 3, 2018.

(51) Int. Cl.
*H01L 23/50* (2006.01)
*B81B 7/00* (2006.01)
*H10D 86/00* (2025.01)

(52) U.S. Cl.
CPC .............. *H01L 23/50* (2013.01); *B81B 7/007* (2013.01); *H10D 86/00* (2025.01); *B81B 2207/07* (2013.01); *B81B 2207/096* (2013.01); *B81B 2207/098* (2013.01)

(58) Field of Classification Search
CPC ........ H05K 1/02; H05K 1/0283; H05K 1/038; H05K 3/361; H01L 23/5387; H01L 23/50; H01L 23/4015; B81B 2207/07; B81B 2207/096; B81B 2207/098
USPC .................. 361/749–751, 777–784, 803
See application file for complete search history.

(56) References Cited

U.S. PATENT DOCUMENTS

| | | | |
|---|---|---|---|
| 5,672,920 A | 9/1997 | Donegan et al. | |
| 5,865,641 A | 2/1999 | Swart et al. | |
| 7,094,117 B2 | 8/2006 | Farnworth et al. | |
| 7,629,720 B2 * | 12/2009 | Koumura | H02K 11/05 310/88 |
| 8,349,116 B1 * | 1/2013 | Bibl | H01L 25/0753 156/273.1 |

(Continued)

FOREIGN PATENT DOCUMENTS

WO 2010/104879 A2 9/2010

*Primary Examiner* — Tuan T Dinh
(74) *Attorney, Agent, or Firm* — ALGM LLP; Harry J. Guttman

(57) ABSTRACT

Circuitry and circuit elements allow harvesting of power. Some embodiments of the invention are circuits that include a contact array, with redundant external electrical contacts, providing a physical interface configured to extract power from a power source for an electronic device in contact with a larger underlying circuit without needing any alignment. The contact array includes a mesh.

15 Claims, 12 Drawing Sheets

(56) References Cited

U.S. PATENT DOCUMENTS

| | | | |
|---|---|---|---|
| 9,478,583 B2* | 10/2016 | Hu | H10H 20/84 |
| 9,632,116 B2 | 4/2017 | Schieleit | |
| 11,309,197 B2* | 4/2022 | Radauscher | H01L 21/6835 |
| 2005/0051889 A1 | 3/2005 | Wood et al. | |
| 2009/0014727 A1 | 1/2009 | Kim et al. | |
| 2011/0260647 A1* | 10/2011 | Catalano | F21K 9/61 |
| | | | 362/362 |
| 2013/0041235 A1* | 2/2013 | Rogers | H05K 1/0283 |
| | | | 600/386 |
| 2013/0069088 A1 | 3/2013 | Speck et al. | |
| 2013/0130440 A1* | 5/2013 | Hu | H01L 24/83 |
| | | | 438/107 |
| 2014/0043775 A1* | 2/2014 | Huang | H05K 7/02 |
| | | | 174/251 |
| 2015/0373793 A1* | 12/2015 | Bower | H01L 25/0753 |
| | | | 362/20 |
| 2016/0095180 A1* | 3/2016 | Miskin | H05B 45/00 |
| | | | 315/185 R |
| 2016/0099274 A1* | 4/2016 | Vora | H01L 27/14663 |
| | | | 257/432 |
| 2016/0099282 A1* | 4/2016 | Vora | H01L 27/14676 |
| | | | 438/69 |
| 2017/0040306 A1* | 2/2017 | Kim | H05K 1/181 |
| 2017/0141619 A1* | 5/2017 | Linnartz | H02J 50/10 |
| 2017/0181276 A1* | 6/2017 | Sawada | B32B 27/38 |
| 2018/0061743 A1* | 3/2018 | Hsu | H05K 1/0283 |
| 2018/0263087 A1* | 9/2018 | Miskin | H05B 45/382 |
| 2020/0176286 A1* | 6/2020 | Rotzoll | H10N 30/88 |

\* cited by examiner oxide resist metal fabric

ELECTRICAL CONTACT ARRAY FOR HARVESTING POWER FROM A POWER CIRCUIT

CROSS-REFERENCE TO RELATED APPLICATIONS

This application claims the benefit of U.S. Provisional Patent Application No. 62/666,166, filed May 3, 2018, the complete contents of which are herein incorporated by reference.

FIELD OF THE INVENTION

Embodiments described herein relate to smart contact arrays for detachable touch sensors, monitored displays, human-computer interaction (HCI) devices and the like that extract power from a soft circuit, which are useful for the operation of electronic textile (e-textile) circuits in a variety of articles, including without limitation garments that serve as wearable sensing devices, wallpaper in a "smart" home controlled by user-placed wall stickers, and other soft HCI surfaces comprising what are considered "soft" circuits because the nature of certain articles makes them not amenable to connection with printed circuit boards and other rigid structures during use.

BACKGROUND

In most current e-textiles, the communications interface and power electronics—including battery packs and wireless modules—are detached before the article is washed, while embedded fiber sensors, conductive traces including antennas, and small integrated circuits increasingly stay with the textile. In the case of examples involving other "soft" circuits, an item such as wallpaper may be replaced or covered over periodically with a new layer of the article. Yet a challenge exists in that, once a connector is embedded, the circuit is fixed, making it difficult for the end user to add new sensors and actuators to the e-textile. Moreover, when a connection between the electronics and the fiber sensors or traces is broken, it is difficult to repair or reestablish the connection, which in some cases renders the garment unusable.

Although not necessarily analogous, in other research areas, Open Dots, Networked Surfaces, and Smart Tables have been tried in an effort to charge or communicate with devices that are not directly aligned with a power or signal transmitter. By way of example, the Smart Table aims to locate devices placed on an active electrode grid, Networked Surfaces consist of pads and a circular array of contacts on a sliding device, and Open Dots provide an array of four contacts for device charging on an electrode grid.

However, rather than suggest a solution to the problem of communicating with a soft circuit, these approaches help illustrate the problem with wearable sensing and other soft electronics, in that they provide most of their benefits when used on printed circuit boards (PCBs) having a fixed geometry. In stark contrast, textiles, garments, wallpaper, and other articles that employ soft circuits as contemplated in the present teachings and embodiments are not as dimensionally stable as firm PCBs formed from stiff materials. Thus, if one were to try to maintain electronical connections needed for stretchable materials and e-textiles, the contact arrays in accordance with presently available technology will not remain dimensionally stable in attempting to align two deformable circuits, and the same lack of stability problem would exist when attempting to establish contact between a conventional rigid circuit and the surface of an e-textile that may shear or slip during use.

Stated differently, in the use of soft circuits, there can be no expectation to attach a multipin contact in registration from one location to the next. Another problem is that in both e-textiles and stretchable electronics applied with thin polymer films, conventional PCB fabrication methods cannot generally be used because of the low temperature tolerances such as when an article must be washed and dried. Accordingly, it is readily apparent that new materials and methods are needed for creating reconfigurable HCI systems based on soft, moving materials.

Thanks to soft electronics, new kinds of wearable and robotic systems now interact safely with the human body. Sensor skins conform to curved surfaces from aircraft wings to robot limbs. However, repair and connection methods for soft electronics lag far behind those for conventional rigid circuits. The absence of a distortion-tolerant connection technology slows innovation.

Because soft connection technology is underdeveloped, manufacturers cannot rapidly assemble soft circuits in the modular style of conventional electronics with board-to-board connectors. It's not just a prototyping problem, but a scale-up problem because in the application space of soft electronics, each product may take on a non-uniform shape. A soft circuit intended for a wearable application must conform to an individual body and may be placed at different locations by the wearer. As a sensor skin, it interacts with the environment and is likely to get damaged.

Meanwhile, a conventional circuit, for example a control board inside a digital camera, takes the same shape across millions of copies and is not likely to crash into unexpected objects inside its case. The need for repairs and revisions is low compared to a soft circuit. Yet, there are industry-standard methods to rework the conventional circuit by soldering if components fail, and to swap in parts using a flat connector cable if a sub-board fails, because PCB fabrication is a mature technology. Thanks to these established interconnect methods, it is far easier to prototype, deploy, repair, and revise a conventional circuit than a soft one, illustrating how the right system of connector materials and methods would be transformative for soft electronics.

Another part of the connection and repair problem is thermal compatibility. Polymers in soft electronics are incompatible with soldering. Conventional printed circuit board (PCB) electronics fabrication and rework sends whole circuits through an oven at 260 C, where most polymers will flow or burn. The soldering problem is not new. It also affects glass screens in liquid crystal displays and flat flexible cables printed on low-cost polyester. A microstructured elastomer connection industry formed in the 1970s, and those technologies are still used by the soft electronics community today. Researchers have only recently added low-temperature materials and methods including ultrasonic bonding, liquid metal contacts, and aerosol metal deposition.

SUMMARY

Some exemplary embodiments herein include self-configuring circuits suitable for use with HCI applications that employ wired sensors and actuators, and which avoid or limit the need for power plugs, wires, and the like. Exemplary circuits may comprise a contact array providing a physical interface configured to extract power from a power source, such as but not limited to lithium ion microbatteries, for an electronic device in contact with a larger underlying circuit such as an e-textile or wallpaper, without needing any alignment. A contact array of some present embodiments may output the maximum and minimum voltages at its contacts and provides startup power for a randomly-placed battery-less sensor, conductive trace, patch, or other conduit for electricity to HCI devices or like materials in soft electronics.

An exemplary contact array may be configured and utilized to obtain power for itself by tapping into a surface having positive and negative voltage traces at unknown locations with respect to the contacts of the array.

Besides wearable technology, there is a broad arrange of applications for embodiments described herein, including without limitation a smart home controlled by user-placed wall stickers, a biochemical sensor monitoring a wound for signs of infection and attached to a patient-worn electronic textile (e-textile) garment, as well as actuators controlled by transmitted command signals. User-configurable e-textile circuits of exemplary embodiments may further be accompanied by novel methods for repairing large-area flexible circuits. In accordance with present embodiments, an Example is described involving a 7×7 contact array suitable for use on various kinds of soft articles with electronic surfaces and circuitry.

An advantage of some present embodiments over conventional conducting materials such as conducting wallpaper that use special patterns of pin spacing on a device, is that unlike the conventional materials, exemplary embodiments may be configured to be amenable to variable placement of the pins and continual power and/or communication signal transmission even if the underlying circuit stretches and no longer has the original pattern prescribed to match the power circuit to the device that must receive the power.

Some embodiments comprise a distortion-tolerant connector/patch is based on a grid of independent electrical contacts. An exemplary patch uses a large array of contacts, each connected to at least one or a pair of diodes or transistors and a pass-through signal connector. This configuration is capable of delivering DC voltages and AC signals to the patch. It may become more powerful as the contact density increases. At high enough density, and on a flexible or stretchable substrate, the structure may resemble anisotropic conductive tape usable in the thin LCD display industry, except with the added ability to send signal, power, and ground to different destinations.

A fabrication challenge exists to maximize the number of independent contacts to the soft electronic surface while also making room for power and signal traces plus supervisory microcontrollers on the connector patch. This challenge may be addressed by a combination of springy microelectromechanical (MEM) contacts with a fabric mesh. These thin-film devices are highly resilient.

An aspect of some embodiments is a modular system where soft circuits may be patched together, simplifying construction and repair of large-area wearables and skins.

The disclosed fiber based carrier materials with attached grippers may contribute to electronic textiles (E-textiles), a rapidly emerging field. Smart materials may be incorporated into E-textiles by embroidering, knitting, weaving, spinning, braiding, coating/laminating, printing and chemical treatments. Mechanical tangling at the microlevel adds a new tool to the E-textiles suite. An exemplary approach uses micro-origami with numerous applications including biomedical devices, energy storage systems, optoelectronics, MEMS, metamaterials, bendable microelectronics, and origami nanorobots.

According to an aspect of some embodiments, devices may be made from thin, flexible films with meandering paths that bend instead of break when stretched. The structures may be transferred to porous, fiber-based carrier materials instead of silicone. Indeed photodiodes, sensors, and other integrated semiconductor devices may all be transferred and attached to porous fiber supports according to exemplary embodiments herein, for a wide variety of applications. Fabrics offer lightweight mechanical support and high conduction of air and fluids, an advantage for wearable sensors, though the contact region is non-uniform compared to a cast silicone film. For this reason, mechanical tangling may be used to adhere MEMS devices onto fabric carriers as opposed to adhesion and other printing based methods which would be difficult to control when transferring thin film devices from wafers to fabrics. Strain-engineered microfabricated grippers may be wrapped around a textile mesh during a final step in a microfabrication process. Applications include but are not limited to sensor integration into breathable structures like tissue engineering scaffolds, bandages, and filters.

Three-dimensional out of plane structures have previously been produced as coiled cantilevers, nano-scrolls and tubes through micro and nano-origami, in which mismatched tensile and compressive stresses in bilayers are employed. Differential thermal expansion or a lattice size mismatch between layered materials can cause released bimorphs to curl uniformly from the substrate. The magnitude of the force, elastic moduli, and the thickness of the film may be controlled to decide the curvature of the bilayer objects. The direction of rolling or folding of the patterns may be controlled by stresses, shape, and direction of etching. Adhesion forces and collision with other objects can change the shape of the structures—an expected outcome when the grippers interact with fabric fibers. In the present work, mechanical tangling between thin-film devices and fiber materials is achieved by strain-mismatched bilayer curling. Exemplary grippers are producible from thin-film bilayers on a silicon wafer. At the final release step, the grippers curled up and interacted with fabrics.

Mechanical grippers may be used to bring electronic contacts from one side of a mesh to the other, which is difficult to do on continuous thin films of other soft materials like silicone or polyimide. Some embodiments use mechanical strain to produce large arrays of redundant grippers from planar thin-film designs. MEMS grippers may be used to make reliable electrical contact with conductive fibers integrated with or inserted into fabrics.

BRIEF DESCRIPTION OF THE DRAWINGS

The drawings, schematics, figures, graphs and descriptions, as contained herein are to be understood as illustrative of structures, features and aspects of the present embodiments and do not limit the scope of the embodiments. The scope of the claims is not limited to the precise arrangements, scales, or dimensions as may or may not be shown in the drawings, nor as discussed in the textual descriptions.

In FIG. 6, the black dots represent pins that do not make contact with either the A or B electrode.

DETAILED DESCRIPTION

Figure 1:
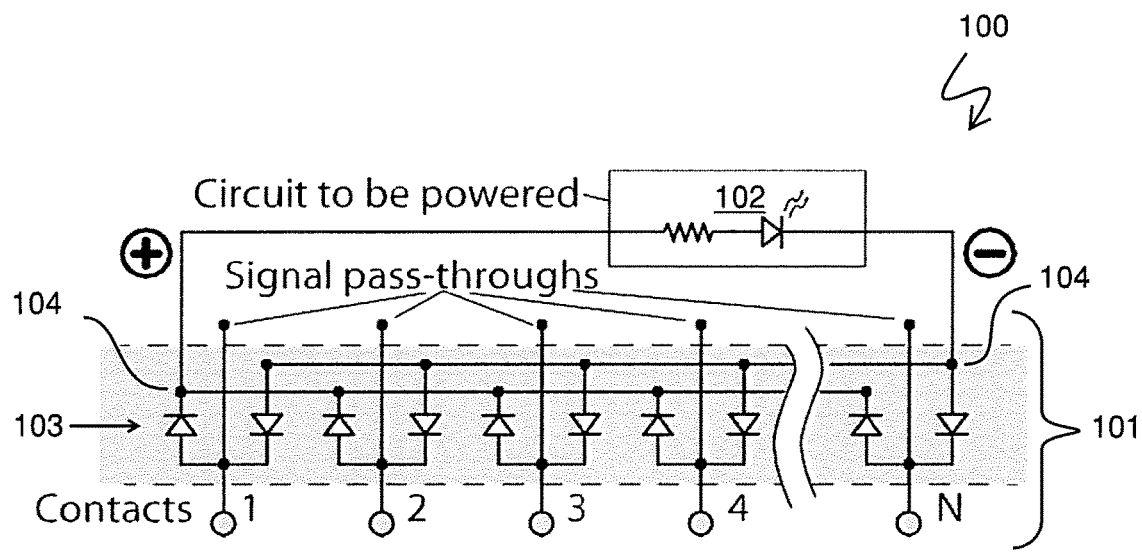
FIG. 1 is a diagram of an array of power collection diodes and signal pass-throughs.

FIG. 1 shows circuitry 100 that harvests external power to in turn power, for example, an HCI device 102 or other e-textile. Merely for simplicity of illustration, device 102 is illustrated as being a load and an output, here an LED. In practice, device 102 may conceivably be of any of a wide variety of circuitry configurations or devices. The device 102 may be on-board electronics such as programmable modules connectable via soft circuit.

Besides device 102, the circuitry 100 comprises electrical contact array 101. The electrical contact array 101 may also be independent of device 102 but for a power connection being established between them. The electrical contact array 101 comprises a plurality of external contacts 1, 2, 3, 4 . . . N (which in some embodiments may be identified as "pins"). The electrical contact array 101 further comprises a plurality of power collection diodes 103 or transistors, at least one or at least two per external contact, configured to extract power from a power source. The electrical contact array 101 further comprises signal pass-throughs for passing communication signals (in contrast to power signals). In addition, electrical contact array 101 comprises a power output (here, output terminals 104) configured to output the maximum and minimum voltages to which the contacts 1, 2, 3, 4 . . . N are exposed.

The electrical contact array 101 obtains power for itself and the connected circuit 102 by contacts 1, 2, 3, 4 . . . N that are configured for tapping into a power circuit surface having positive and negative voltage traces, but which are at unknown or otherwise variable locations concerning their positioning with respect to the contacts 1, 2, 3, 4 . . . N.

Figure 2:
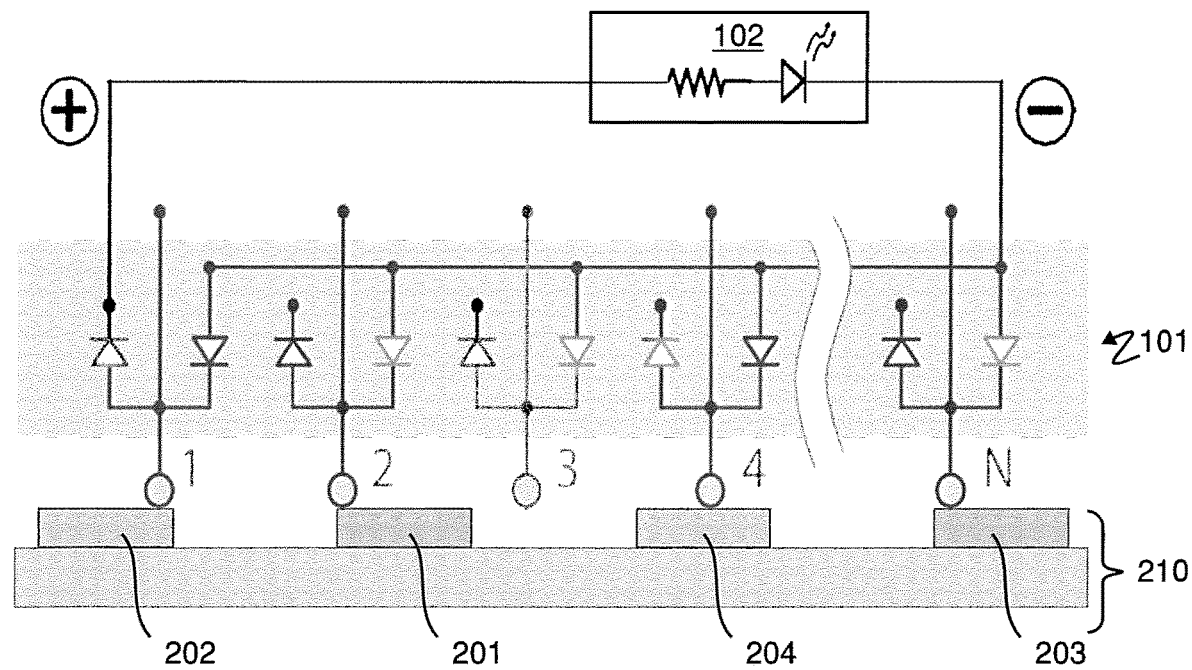
FIG. 2 is an electrical diagram of a contact array collecting and distributing power from an interdigitated electrode surface.

FIG. 2 illustrates an electrical contact array 101 collecting and distributing power from an underlying power circuit 210 with positive and negative voltage traces 201, 202, 203, and 204. The contact array 101 may be placed or positioned randomly on the underlying circuit. The underlying power circuit 210 may comprise a surface with exposed interdigitated electrodes. In FIG. 2 the traces 201 and 203 are positive contacts and the traces 202 and 204 are negative contacts. Contact array 101 may be placed or positioned randomly with respect to the power circuit traces 201, 202, 203, 204, etc. such that some of the contact pins do not contact any power circuit trace. Contact pin 3, for example, is non-conducting in the illustration as it did not come into contact with any underlying power trace, at least not for the position illustrated.

FIG. 1 illustrates an embodiment in which each contact pin 1, 2, 3, 4 . . . N is connected to two diodes and a pass-through. The diodes (in contact with an underlying trace) produce a rectified power signal while maintaining electrical isolation between positive and negative traces of the underlying power circuit 210. In turn, the pass-throughs transmit any communication signals originating from the surface of the HCI device 102 or being transmitted to the device 102. Though traces 201, 202, 203, and 204 have been identified as power traces in this particular illustration, any one or more of the traces may be configured instead as a communication signal terminal. The configuration of contact array 101 as illustrated makes the device equipped to work with a wide variety of underlying circuits 210 irrespective of certain differences in arrangement and positions of power traces and communication signal terminals/traces. The contact array is self-configuring in that irrespective of the position or placement of the contact array with respect to the underlying circuit, it can still collect and conduct power and communication signals from the underlying circuit.

To prevent shorting, the contact pins 1, 2, 3, 4 . . . N involved in power collection should be narrower than the smallest gap on the power circuit. Each pin is pointy (narrow) so it cannot touch two different traces at once and short them together. The pin spacing, however, may be bigger than the smallest gap on the power circuit. With random alignment, some of the pins might not contact a power circuit trace, an example being pin 3 in FIG. 2. The contact array 101 must span at least one positive and one negative trace (and preferably more if there is a possibility of defects and distortion in the underlying power circuit) to ensure that the on-board electronics of 102 such as programmable modules connectable via soft circuit will receive power. In some embodiments, transistors may be used in place of diodes. Transistors are made using the same materials and processing techniques as diodes, and they can enable a signal from a supervisory microcontroller to turn on (closed circuit) or turn off (open circuit) the conductive path from the contact pin to the device. Materials and processing techniques are employable to transfer working diodes and spring contacts to a fabric surface.

An example of contact spacing in the exemplary contact array is 4 mm. Other suitable spacing distances may include but are not limited to 10 mm or smaller, 9 mm or smaller, 8 mm or smaller, 7 mm or smaller, 6 mm or smaller, 5 mm or smaller, 4 mm or smaller, 3 mm or smaller, 2 mm or smaller, 1 mm or smaller, at least 1 mm, at least 2 mm, at least 3 mm, at least 4 mm, or some combination of these qualifications. Small surface mount packages and automated assembly equipment may be used to reduce the pin spacing below 4 mm. Moreover, certain levels of miniaturization may be achieved by making the contact array directly from thin film semiconductors. For example, thin films of silicon and other semiconductors, which bend because of their thinness. This prevents the material from exceeding the breaking strain during bending. Thin semiconductor films can be integrated directly into flexible articles for a conformal contact array using the novel arrangements described herein.

A number of applications in HCI devices become readily apparent with the use of the smart contact arrays of present embodiments. These include, but are not necessarily limited to: electrical connections for user-positioned sensors on wallpaper, tablecloths or other soft HCI surfaces; repair "materials" enabling a non-expert user to identify and reconnect broken traces on a large-area HCI circuit; connectors for human activity sensors on materials that otherwise might distort the pin pattern due to stretching, a problem likely to be encountered in a variety of settings especially clothing but which is suitably addressed by present embodiments which do not require dimensional stability or rigid PCBs as with conventional approaches.

In the case of human activity sensors such as biosensors for pulse, blood pressure or other vital signs, an exemplary contact array may collect analog signals from passive sensor elements built into the surface of the biosensor. The contact array or a further circuit in connection therewith may then digitize the collected analog signals and transmit them for monitoring a condition of a subject. Further, it is contemplated that through the practice of some present embodiments, a number of lightweight, repositionable sensors in a single article such as a garment with wearable sensing technology may be provided which draw power from a shared external battery pack.

Contact arrays of the present embodiments are suitable for use in powering electrodes that measure, for example, muscle signals and resistive strain sensors made from knit conductive threads. To this end, PCT/US19/15520, filed Jan. 29, 2019, and U.S. Provisional Patent Application 62/623,078 ("Stretchable Optical Fibers for Strain-Sensitive Textiles"), filed Jan. 29, 2018, describe example systems in which present embodiments may be employed. The complete contents of PCT/US19/15520 and U.S. App. No. 62/623,078 are incorporated herein by reference. When tracking muscle activation sequences with sensors, a one-size-fits-all approach fails given that each individual has well-defined anatomical landmarks that are unique from person to person. Thus, the unmet need for spatial customization is one of the problems currently limiting the adoption of smart athletic garments, but which can be successfully addressed through the use of flexible and stretchable substrates in accordance with the current embodiments.

An embroidered interdigitated electrodes pattern on fabric would be suitable to power a smart contact array dropped into a pocket and provide the device secure wired connections to sensors embedded in sports medicine wearables and other biomedical wearable sensors.

Figure 3:
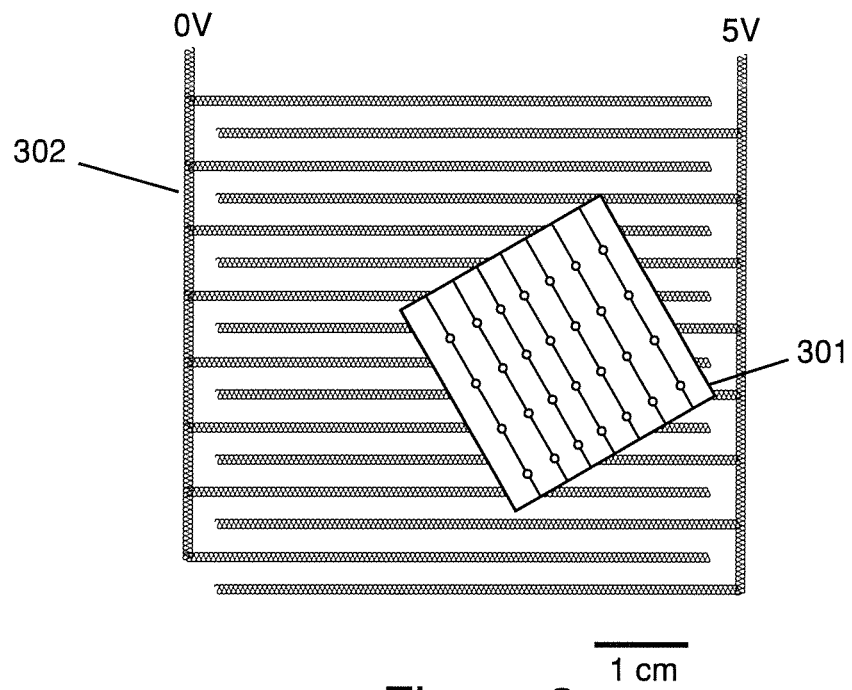
FIG. 3 shows embroidered interdigitated electrodes for power supply to a variably positioned rigid contact array brought in contact with the power electrodes.
Figure 4:
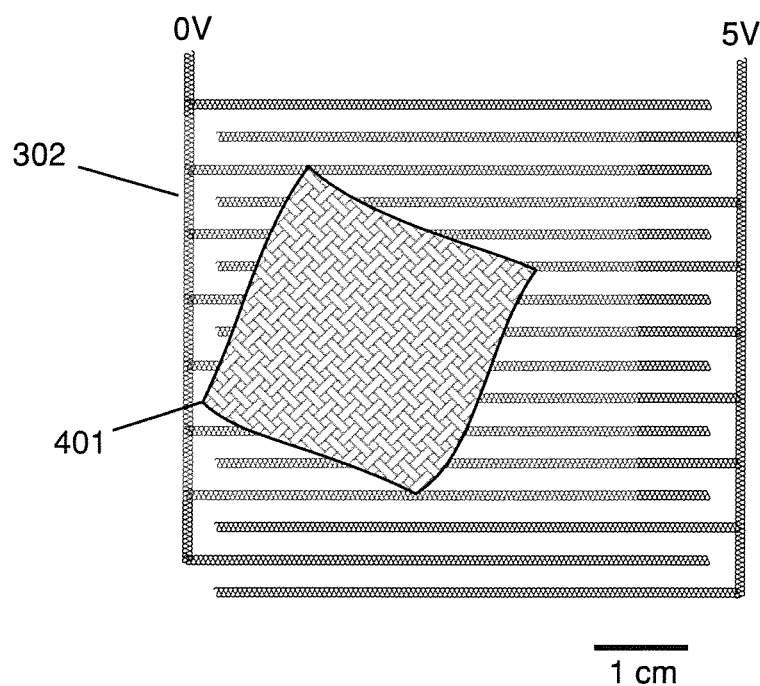
FIG. 4 shows embroidered interdigitated electrodes for power supply to a variably positioned soft contact array brought in contact with the power electrodes.

FIG. 3 shows a configuration that includes an embroidered pattern 302 of the fabric in contact with a contact array 301. The pattern 302 is completed with conductive thread (e.g., silver-plated nylon thread). In simulated testing, the embroidered electrode pattern 302 with the geometries described above was supplied with 0 and 5V. FIG. 4 is shows contact array and e-textile circuit 401 collecting power from interdigitated electrodes 302 which are arranged as shown schematically in FIG. 2. The circuit 401 may be made from conformal materials, for example.

The contact array 301 is an example of a rigid contact array with the physical and electrical configurations described herein, whereas the contact array 401 is flexible and may also be stretchable. Embodiments may comprise body-conforming arrays with flexible and stretchable substrates. Such flexible and stretchable embodiments may be achieved using the same principles described here with thin film semiconductor materials and using photolithography and conventional microfabrication techniques.

Some embodiments comprise a patch comprising a contact array, with the patch being configured for repairing circuits even if those circuits being repaired were not designed expressly to run a contact array. In this arrangement, the contact array is configured to tap into an operating electronic textile that carries a power line and ground line sparsely over the circuit area. When the contact array rests across these signal and power lines, it can extract power for the on-board electronics of an e-textile article.

In some embodiments, the contact array is made from a thin material that conforms to the surface of a circuit. Conformal contact array embodiments may be configured to patch a broken power line (or lines) and inject power or signals into a different part of the underlying circuit of a given article.

Applications from the present embodiments include other HCI devices, for example those which are configurable by an end user. Through the teachings provided herein, power could be provided to a smart home control system based on a user attaching switches, sliders and small displays to a large-area wallpaper that has electronic traces built in. In this application, the smart contact array would let the user power small devices at any position on the wall, and with any orientation.

Contact array pin shape may vary among embodiments. It was found that pins of a slight saddle shape were less reliable for consistent contact between contact array and underlying power circuit. In some embodiments the contacts may be spring contacts.

To achieve certain performance metrics (e.g., reliability of connectivity) a power circuit may be configured to be particularly suited to a contact array or vice versa. However, the two elements may be implemented independent of one another and yet be compatible. What is desirable in exemplary applications is for the underlying power circuit to have an arrangement that, on average, will put some of the contacts of the contact array on a positive trace and others on a negative trace. It will be appreciated that interdigitated positive and negative electrode arrays like 302 of FIGS. 3 and 4 may be described using just two parameters: the electrode width and the electrode gap. The contact array should be configured such that the contact array's contact pins are narrower than the smallest gap between traces on the power circuit.

A method of harvesting power from a power circuit that has positive and negative voltage traces may be described as follows. A first step may comprise randomly positioning a contact array with respect to the power circuit traces such that some of the contact pins do not contact any power circuit trace, the contact array comprising contact pins that are narrower than the smallest gap between traces on the power circuit. A second step is outputting the maximum and minimum voltages to which the contacts are exposed.

Figure 5:
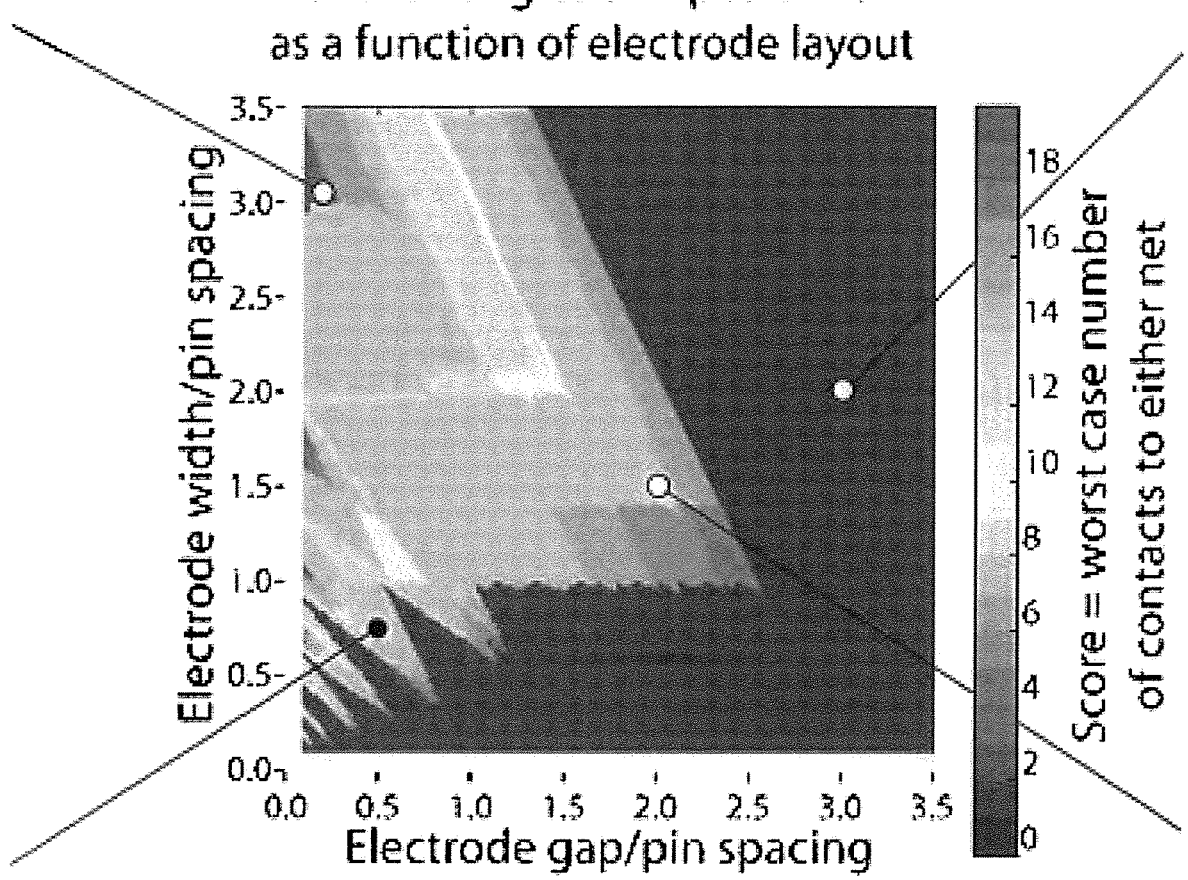
FIG. 5 is a graph of electrode width (Y-axis) against electrode gap/pin spacing (X-axis) for an interdigitated power surface with color coding to indicate favorability based on the minimum number of contacts (worst-case scenario) to the A or B net over all positions and all rotations of a 7×7 contact array with 49 contact points.
Figure 6:
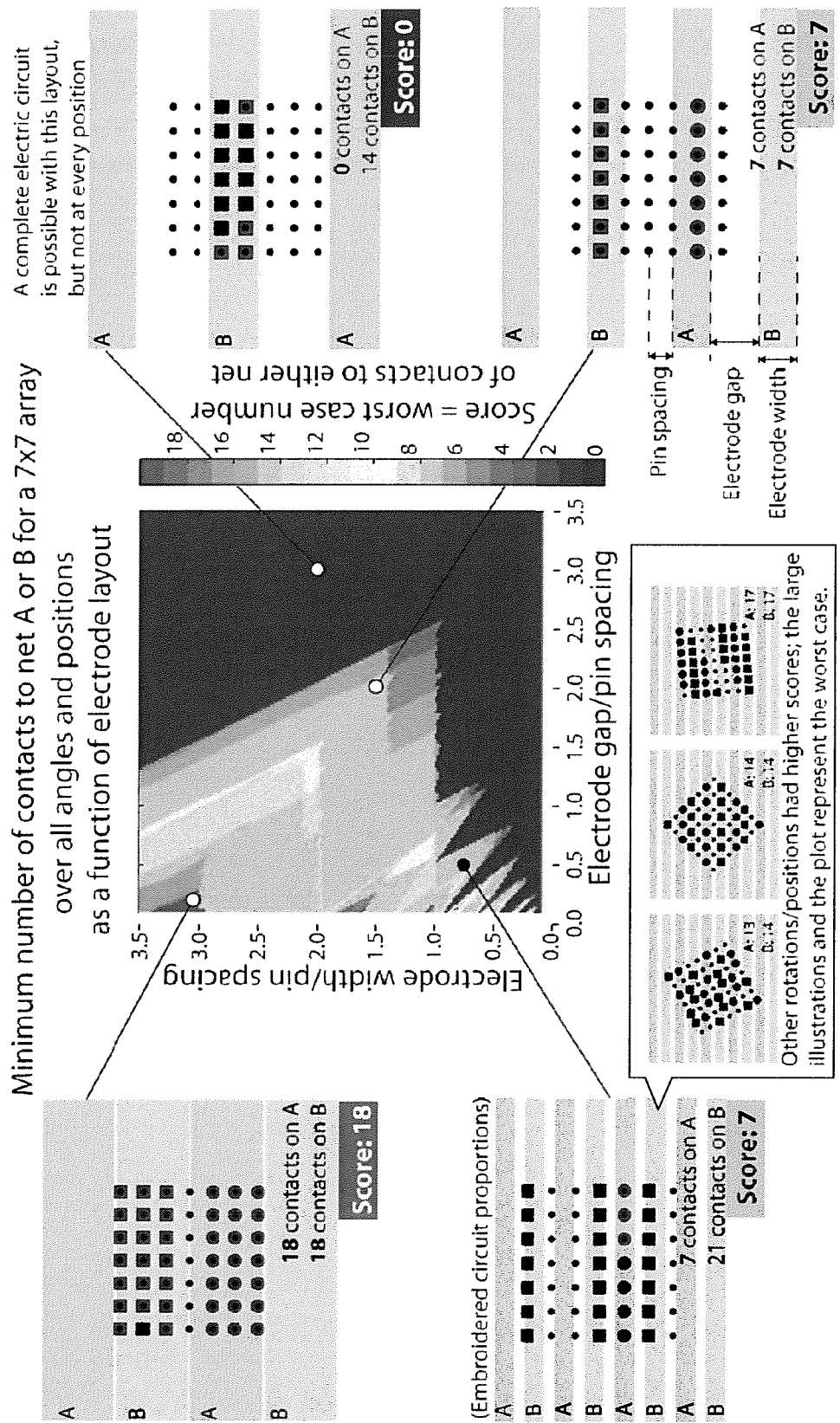
FIG. 6 reproduces FIG. 5 and accompanies it with additional images around FIG. 5 providing illustrations of the electrode array and interdigitated electrodes at different positions plotted in FIG. 5.

FIGS. 5 and 6 characterize performance variations based on different pairings of electrode width and electrode gap for an interdigitated power surface. FIG. 5 is a graph of electrode width (Y-axis) against electrode gap/pin spacing (X-axis) with color coding to indicate favorability based on the minimum number of contacts (worst-case scenario) to the A or B net over all positions and all rotations of a 7×7 contact array with 49 contact points. FIG. 6 reproduces FIG. 5 and accompanies it with additional images around FIG. 5 providing illustrations of the electrode array and interdigitated electrodes at different positions plotted in FIG. 5. In FIG. 6, the black dots represent pins that do not make contact with either the A or B electrode.

It will be appreciated that closely-spaced electrodes like those in the top left of FIG. 5 provide the greatest assurance that a contact array will find power irrespective of the position or placement of the contact array with respect to the power circuit electrodes. That said, larger power electrode gaps create space in the layout for other electrodes that carry communication signals instead of power. Therefore, some embodiments may employ layouts like the one in the lower right of FIG. 5 for self-configuring applications that undergo changes in positioning, such as occurs with a garment being worn or when a sensor is repositioned, and which need to communicate over the surface.

If signals outside an expected power range are to be used, distortion may be mitigated by active switching. A changing voltage detected at a microcontroller pin while other pins remained at 0 or 5V would indicate a signal (rather than sliding of the whole array). The signal pin may then be disconnected from the power-collection circuit using transistors. When used in a battery-free contact array, this active approach may depend upon a passive contact array to initially power up the onboard electronics.

Some embodiments comprise or consist of distortion-tolerant connectors for soft electronics. Some embodiments apply microscale semiconductor components to fabrics to solve the problem of electrically connecting two soft circuits with unknown contact locations. An exemplary embodiment is a conformal patching diode array.

Stretchable electronics may comprise materials that can stretch to produce considerable distortion.

Figure 7:
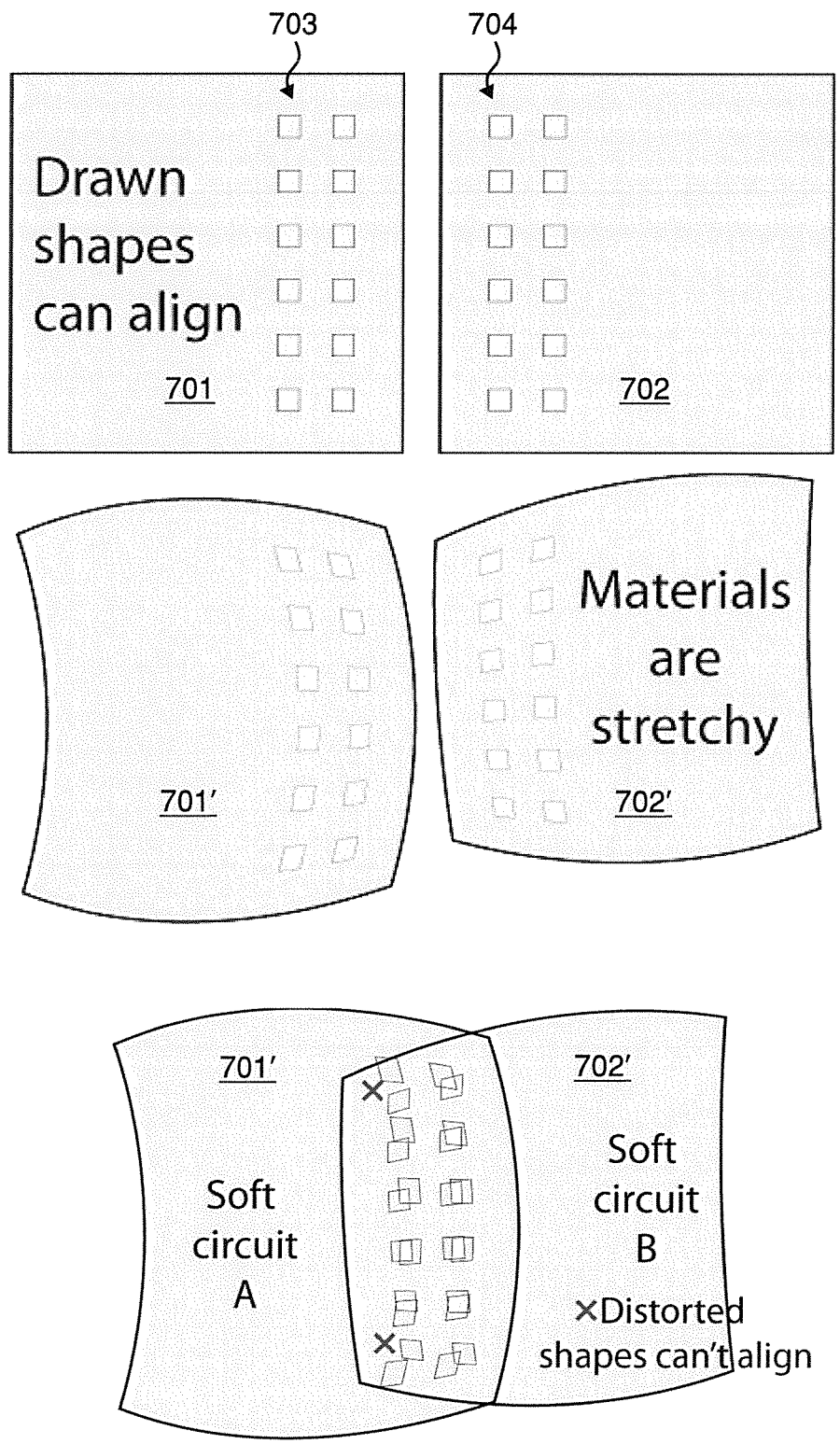
FIG. 7 illustrates a distorted contact alignment problem for stretchable circuits.

FIG. 7 illustrates a problem introduced by stretchable electronics: electrical contact distortion in materials that can stretch. Some stretchable electronics may comprise silicones, which may stretch 4× or greater beyond their original length. Some stretchable electronics may comprise hydrogels, which may stretch beyond 10× their original length.

FIG. 7 shows two circuits 701 and 702 which have matching contact arrays 703 and 704 respectively (each a 2×6 array in this illustrated example). Circuits 701 and 702 may be two rigid circuits. With two rigid circuits, after two points on the surface of 701 are located and aligned with two points on the surface of 702, every contact pad in the array 703 is aligned with every contact pad in array 704.

Circuits 701 and 702 may alternatively be flexible and/or stretchable circuits. As a simple non-limiting example, a stretchable circuit 701 may comprise a Spandex fabric substrate with a soft circuit contact pad made from silver ink, inkjet printed onto the Spandex fabric. In stretched states, the circuits are labeled as 701' and 702' respectively. When connecting to a stretchable circuit, there is no guarantee things can ever be aligned, especially if one of the circuits is already installed on a curved surface. FIG. 7, at figure bottom, shows an attempted connected of the arrays 703 and 704. Even under a best fit, it is not possible for all contacts of the two arrays 703 and 704 to contact one another. Some contact pairs have large contact areas, some small contact areas, and some no contact at all because the distorted contact shapes cannot align. The latter case is marked a with small "x" in each instance in FIG. 7.

Figure 8:
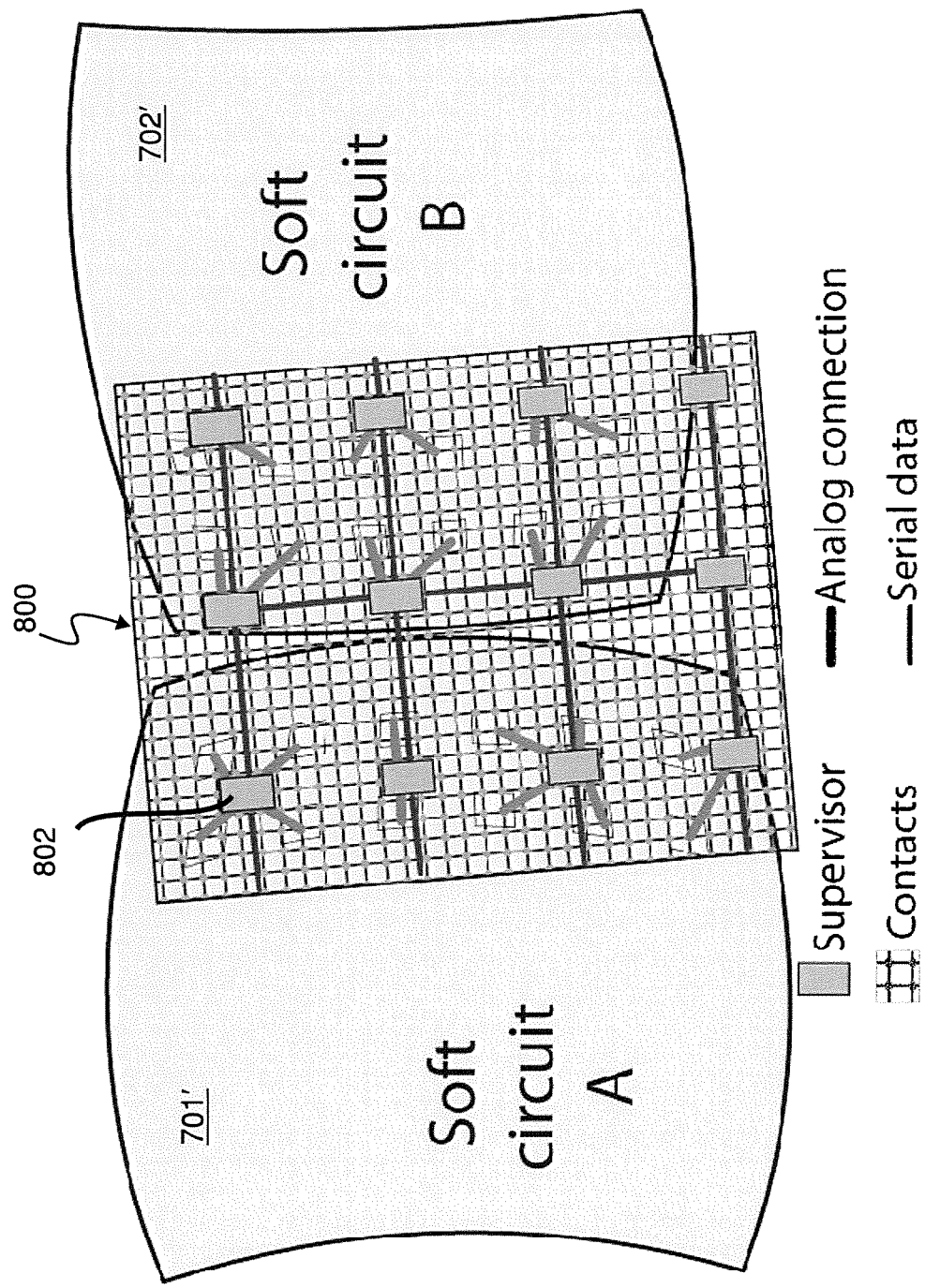
FIG. 8 shows a soft electronic patch solving a distorted contact problem among a group of circuits at least one of which is a soft circuit.

FIG. 8 shows a soft electronic patch 800 solving the distorted contact problem. The soft circuits 701' and 702' under the patch 800 supply power and ground to the patch 800. The patch 800 transmits or receive signals that need to be linked across the soft circuits 701' and 702'. An exemplary soft electronic patch 800 comprises an array of microelectromechanical system (MEMS) contacts, means for routing signals and power to a supervisory circuit, and a porous fiber-based carrier.

A soft electronic patch 800 may comprise a textile with integrated semiconductor components and large arrays of redundant, springy electrical contacts. The redundancy means that only some of the electrical contacts need to make an electrical connection with an underlying circuit for the patch 800 to operate as expected. (Recall contact 3 from FIG. 2, which did not need to contact the underlying circuit 210 for the contact array 101 to work as intended.) When a patch 800 is placed in contact with a distorted pad array 703 or 704, the pad routes signals and power to a supervisory circuit 802 (though twelve supervisory circuits are illustrated in FIG. 8, only one is explicitly labeled for clarity of illustration). The supervisory circuit 802 may be a supervisory microcontroller and multiplexer that scans the contacts in its neighborhood and encodes the information in a serial stream. FIG. 8 shows analog data collection between contact terminals of arrays 703 and 704, and serial data connections among the supervisory circuits 802. A patch 800 may comprise small microcontrollers in large modular arrays. Fabrication of a patch 800 may comprise applying aerosol metal coatings, including metal traces, in 3-D printed sockets for the supervisory circuits (which may be microcontrollers).

An exemplary patch 800 includes a porous fiber-based carrier that makes through-surface electrical connections possible. An important distinguishing feature of a textile platform is the high porosity of fabric compared to the thin solid polymer or elastomer films used in most other soft electronics research. The fabric structure permits electrical contacts to run from the contact side to the other side of the connector patch without etching or drilling. Fabric construction methods may also incorporate fine wires directly in the textile to carry signals.

Though an exemplary patch 800 may be well suited for use with soft circuits, it may also be employed in connecting hard circuits or a combination of soft and hard circuits. Exemplary patches 800 may, for example, be used with textiles and microfabricated silicon devices.

The contacts of exemplary contact arrays and patches may comprise strain-engineered micromechanical grippers configured to mechanically entangle with fabric carriers and provide adherence of MEMS devices to the fabric carrier.

Figure 9:
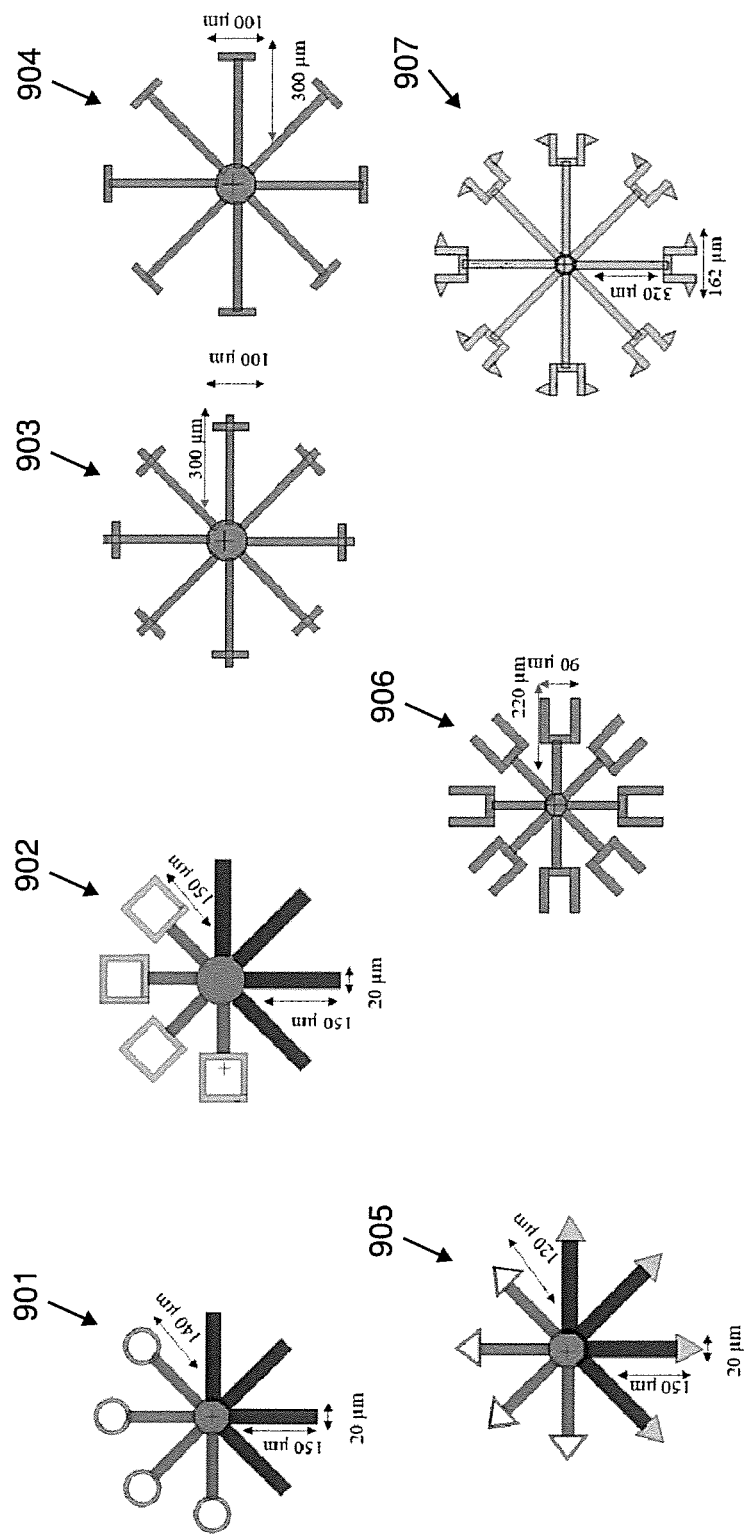
FIG. 9 shows a variety of alternative gripper configurations.

FIG. 9 shows a variety of alternative grippers with arm lengths in the range of 200 microns. Non-limiting examples of gripper configurations include clasp 901, square clasp 902, cross 902, log/cross-bar 904, triangle clasp 905, claw 906, and claw with hooks 907. Exemplary non-limiting dimensional examples are shown in FIG. 9 as well.

The radius of curvature for reliable clasping depends on the fabric being clasped.

Exemplary non-limiting fabrics may have fibers in the 50 to 100 micron diameter range. The reciprocal of radius of curvature for a released gripper arm of uniform width is given by, $$\frac{1}{\rho} = \frac{6\varepsilon(1+m)^2}{d[3(1+m)^2 + (1+mn)\{m^2 + (mn)^{-1}\}]} \quad (1)$$

$$= \frac{6\varepsilon d_1 d_2}{d^3} \quad (2)$$

Figure 10:
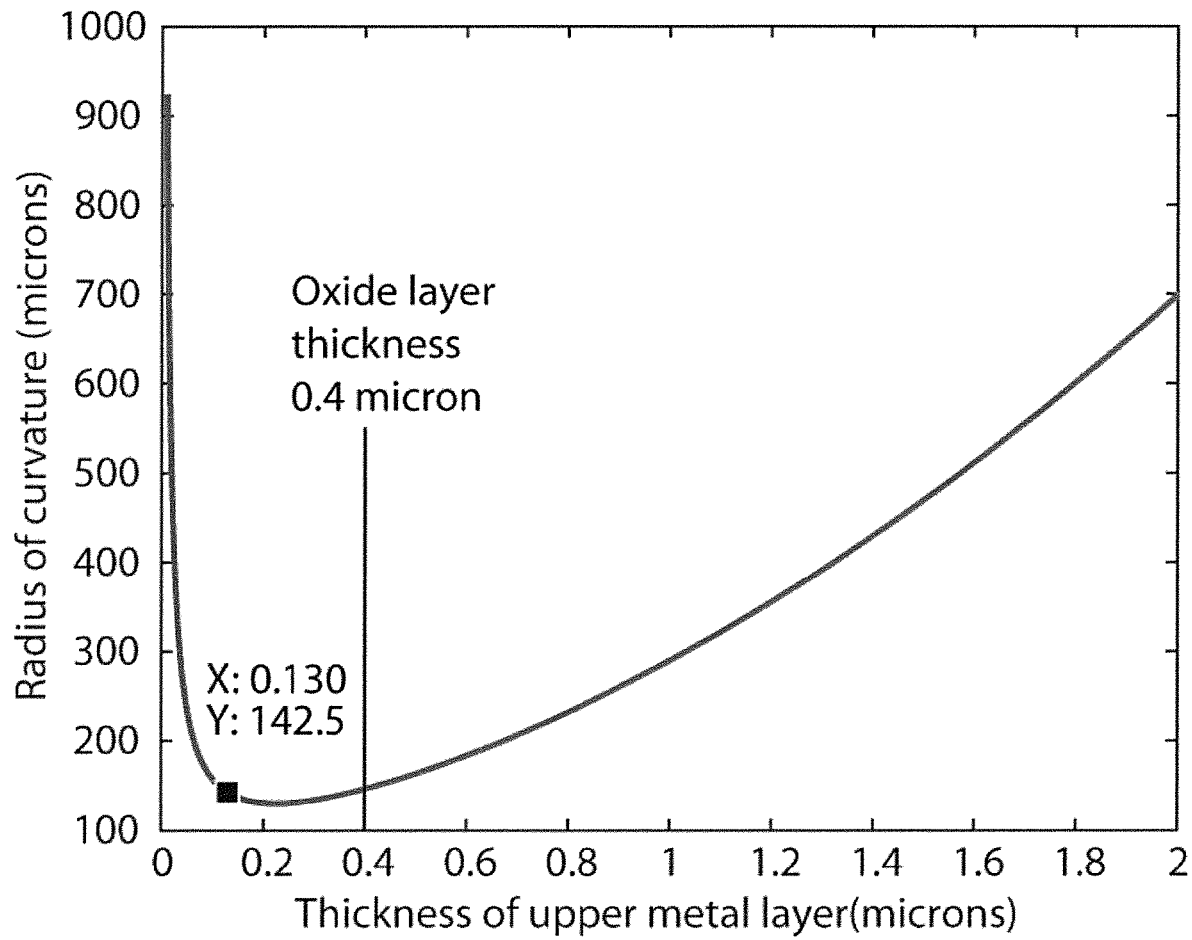
FIG. 10 is a plot of radius of curvature versus thickness of upper metal layer in a bilayer of a gripper; the minimum radius occurs when the metal layer is approximately half the thickness of the oxide.

Equation (1) reduces to equation (2), if both layers have same biaxial moduli. In the above equation, $\rho$ is the radius of curvature, $d=d_1+d_2$, combined thickness of two layers, n is the ratio of the elastic modulus of the two layers ($E_1/E_2$) and m is the ratio of their thicknesses, ($d_1/d_2$), $\varepsilon$ is the strain mismatch given as follows, $$\varepsilon = \frac{\sigma_{metal}(1-\nu_{Metal})}{E_{Metal}} - \frac{\sigma_{oxide}(1-\nu_{Oxide})}{E_{Oxide}} \quad (3)$$

where $\sigma$ is the biaxial stress, $\nu$ is the Poisson's ratio, E is the elastic modulus. The choice of the thickness of upper metal layer in the bimorph greatly affects the radius of curvature. From equation (1), with a SiO2 layer thickness of 400 nm, and other parameters as listed in Table 1, the plot of FIG. 10 is obtained showing radius of curvature versus thickness of upper metal layer.

TABLE 1

Properties of an exemplary bilayer for grippers

| Material | Elastic Modulus (GPa) | Poisson's Ratio | Measured Thickness (nm) | Measured Residual Stress (MPa) | Calculated Radius (microns) |
|---|---|---|---|---|---|
| Cr | $E_{Metal}$ = 140 | $\nu_{Metal}$ = 0.21 | 130 | $\sigma_{Metal}$ = 160 ± 5 (tensile) | 142 ± 5 |
| Oxide | $E_{Oxide}$ = 71 $E_{Oxide}$ = 83 | $\nu_{Oxide}$ = 0.20 | 400 | $\sigma_{Oxide}$ = 300 ± 25 (Compressive) | |

Figure 11A:
FIGS. 11A to 11F show an exemplary process of fabricating a micromechanical gripper including its attachment to a fabric fiber.
Figure 11B:
Figure 11C:
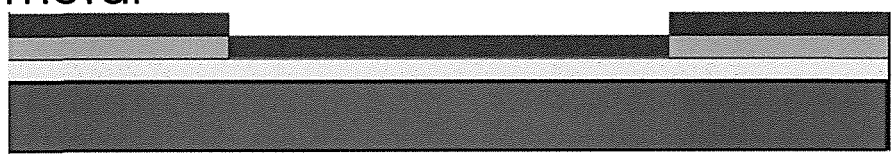
Figure 11D:
Figure 11E:
Figure 11F:
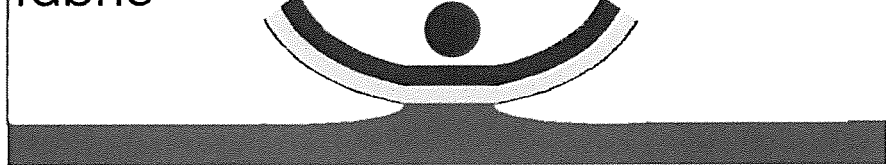

FIGS. 11A to 11F illustrate an exemplary method for fabricating grippers and attaching them to a textile carrier. FIG. 11A shows a thermal oxide deposition on a silicon substrate. In FIG. 11B, a predetermined resist pattern is produced with photolithography. FIG. 11C shows metal (e.g., chromium) deposition which may be by sputtering. FIG. 11D shows metal lift-off in solvent. Next in FIG. 11E are steps of wafer dicing and oxide etching using the metal as a mask. At FIG. 11F fabric fibers are tightly attached over the chips and silicon is etched (e.g., by xenon difluoride) through the fibers, releasing the gripper structures. Partial release, leaving grippers tethered to the wafer at their centers, may be achieved by reducing the number of etch cycles.

Figure 12A:
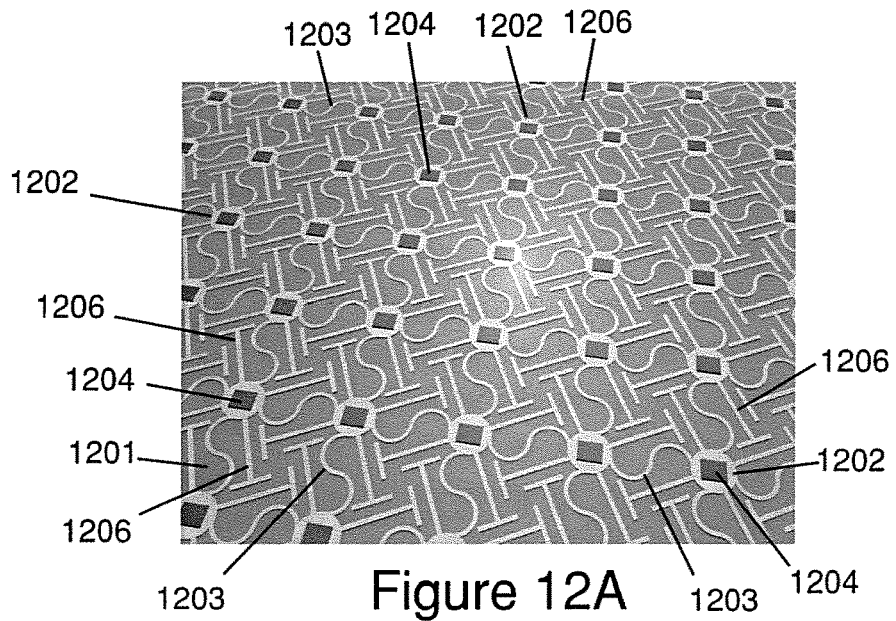
FIGS. 12A to 12C show semiconductor devices transferred from a wafer to a textile using strain-engineered grippers.
Figure 12B:
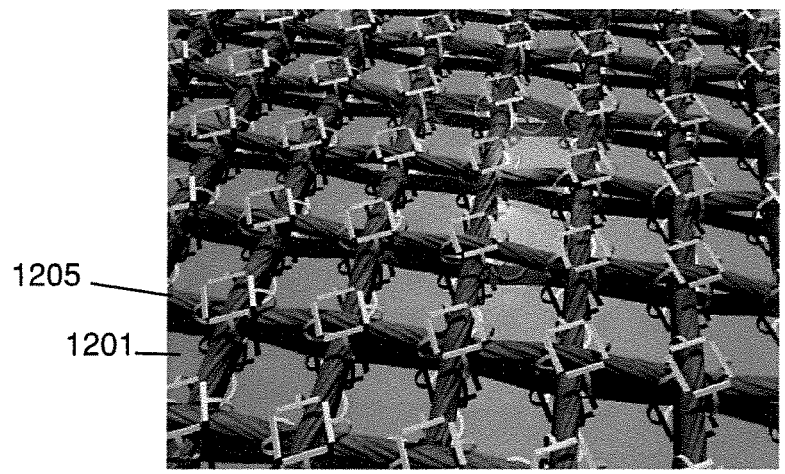
Figure 12C:
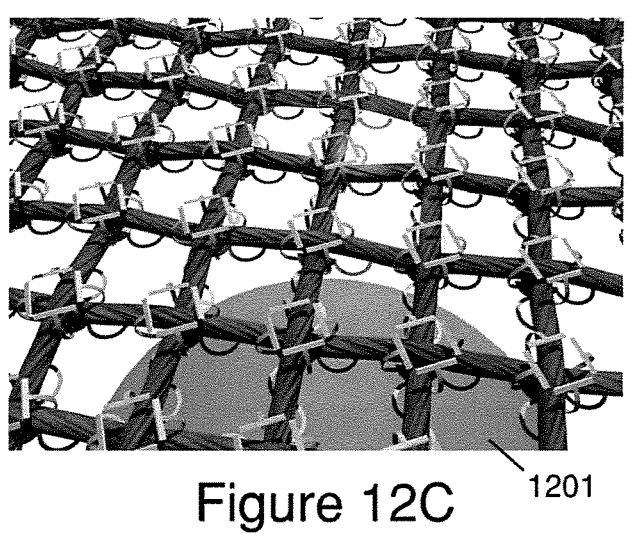

While FIGS. 11A-11F shows a single fiber in a cross-sectional view, FIGS. 12A to 12C illustrates a perspective view of grippers transferring semiconductor payloads to a fabric swatch, creating a porous structure with mechanical strength coming from fibers and functionality from thin-film devices. The alignment of fibers and grippers may be random or controlled.

FIG. 12A corresponds closest with FIG. 11E; a 2D thin film strain-mismatched bilayer has been fabricated but remains flat and attached to a wafer substrate 1201. The illustrated patterns includes an array of redundant microelectromechanical system (MEMS) contacts 1202 with gripper arms 1206, conductive metal traces 1203 for routing signals and power to a supervisor circuit, and a plurality of supervisor circuits 1204 each arranged at a respective node. Exemplary conductive traces are meandering paths, which when subject to moderate forces are able to distort instead of breaking. The supervisor circuits may each include a power rectifying circuit, such as a diode pair. In FIG. 12B, the thin film pattern has been positioned adjacent to a fabric carrier 1205 and the bilayer (including the conductive top layer of the 2D thin film and the bottom layer) is released from the substrate. The release from the substrate and inherent tensile properties of the gripper arms cause the arms to curl about the adjacent fibers of the fabric carrier. Transferring the microfabricated structures to fabrics via secure mechanical joints may require fiber wrapping, preferably more than halfway around in at least some embodiments. FIG. 12C shows remaining substrate being removed, leaving only the array of MEMS contacts, conductive traces, and the porous fiber-based carrier. The resulting structure has a dense array of electrical contacts on one side, and rectifying devices with connector wires on the other.

For the materials and thicknesses in Table 1, it was found that structure lengths of 200 microns and greater are sufficient for hooking on polyester and nylon woven and knit fabrics having fiber diameters in the 50- to 100 micron range, and having mesh openings in the 500 micron to 1 mm diameter range. Features such as crossbars (904 in FIG. 9) and a "crab claw" (906 in FIG. 9) spanned more of the fiber surface; devices that rely on contact area for adhesion may include such features at the ends of the grippers. The three "clasp" designs (901, 902, and 905 in FIG. 9) were too short (<200 microns) to surround these fibers at the −150 micron radius of curvature. However, such configurations may suit differently sized and configured fibers. Individual gripper specifications may also among embodiments, including but not limited to arm length. As mentioned previously, fabrication may entail intentional fiber alignment with gripper contact arrays. Alternatively, positioning may be random. If alignment is not possible, increased gripper density may be used to help ensure a strong bond between a thin film device array and a fabric.

Figure 13A:
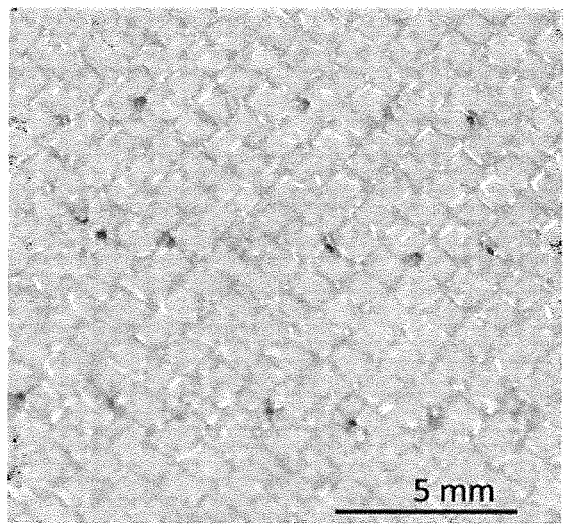
FIG. 13A is a photograph of arrayed MEMS grippers transferred to a fabric mesh.
Figure 13B:
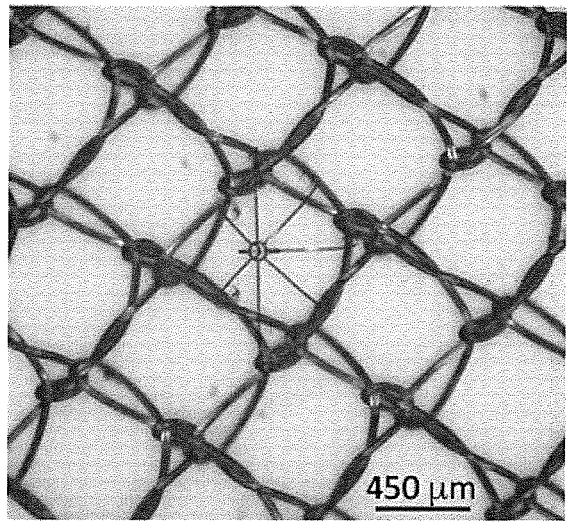
FIG. 13B is a photograph of an individual MEMS gripper.
Figure 13C:
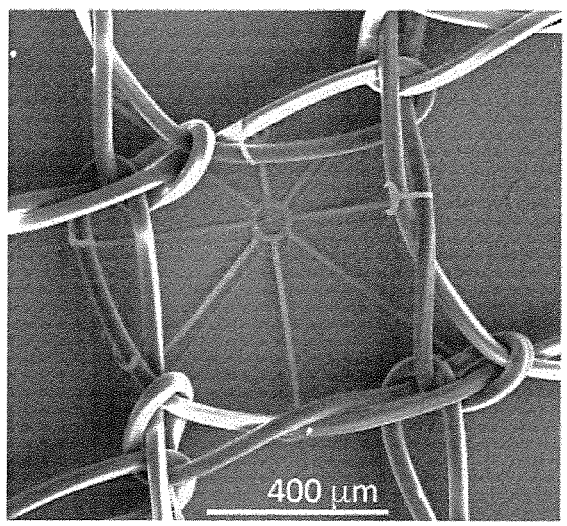
FIG. 13C is an electron micrograph of a gripper seen from the contact side of the material, just after transfer from a silicon substrate.
Figures 14A, 14B:
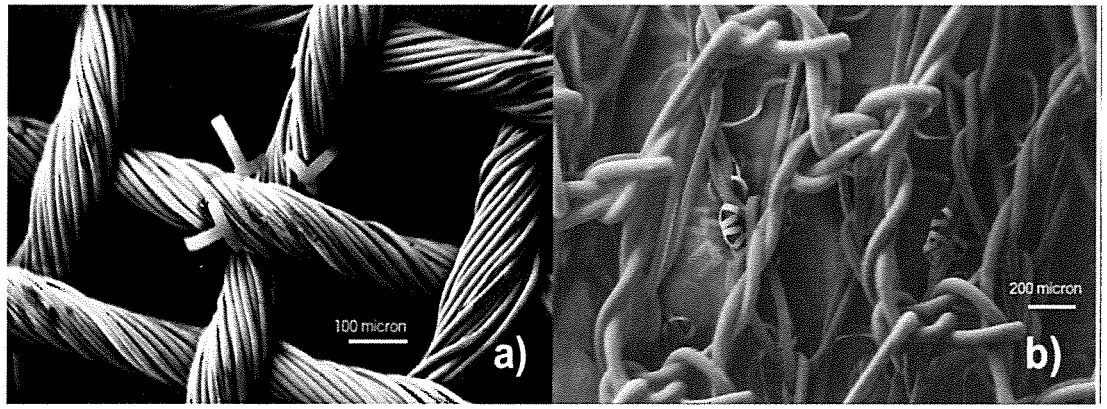
FIG. 14A is an electron micrograph of a gripper successfully attached to woven polyester fabric.
FIG. 14B is an electron micrograph of a gripper successfully attached to a knit nylon fabric.
Figures 14C, 14D:
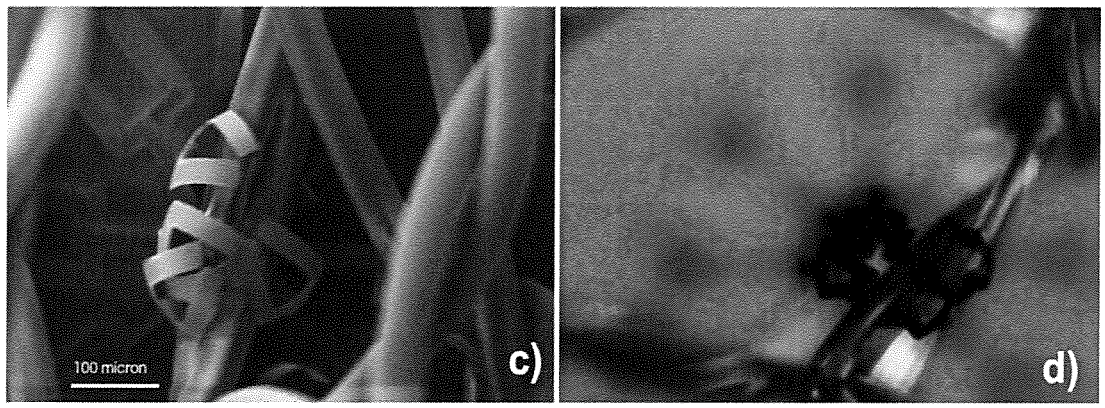
FIG. 14C is zoomed view of the FIG. 14B micrograph, showing secure clasping of 50 micron diameter fibers by the "crab claw" design.
FIG. 14D is an optical micrograph of a knit nylon fabric showing interaction between polymer fibers and bilayer materials.

FIG. 13A is a photograph of arrayed MEMS grippers transferred to a fabric mesh. FIG. 13B is a photograph of an individual MEMS gripper. FIG. 13C is an electron micrograph of a gripper seen from the contact side of the material, just after transfer from a silicon substrate. FIG. 14A is an electron micrograph of a gripper successfully attached to woven polyester fabric. FIG. 14B is an electron micrograph of a gripper successfully attached to a knit nylon fabric. FIG. 14C is zoomed view of the FIG. 14B micrograph, showing secure clasping of 50 micron diameter fibers by the "crab claw" design. FIG. 14D is an optical micrograph of a knit nylon fabric showing interaction between polymer fibers and bilayer materials.

Some embodiments comprise fabricating silicon diodes then releasing them from the surface without damaging the devices. This suspended air isolation method is rarely seen now, but its predecessor was one of the earliest approaches (pre-1960s) toward electrical decoupling of semiconductor devices fabricated on a single substrate.

Silicon diodes may be defined by ion implantation in an oxidized silicon-on-insulator device layer, followed by the MEMS gripper process (e.g., see FIGS. 11A-11F and 12A-12C) modified to make electrical contact with the terminals of each diode through an additional etch step before metallization. Diodes will be nearly freed from the substrate by back-etching from the underside with a deep reactive ion etch (a process which may also be used to make fiber-alignment holes), then completely released from the front side in a brief XeF2 silicon etch at the same time the MEMS grippers are released onto aligned fabrics.

Patch-to-surface electrical contact area may be increased by aerosol printing a conductor onto the tips of released devices to increase their conductive surface.

EXAMPLES

Example 1

In a prototypical embodiment, this circuit was formed as a sandwich between two PCBs, with the contacts made by soldering 1/16 inch (1.6 mm) diameter brass spheres to 1 mm diameter via using solder paste. Between the two boards, diodes (from STMicroelectronics, Geneva, Switzerland, manufacturer part number TMMBAT48FILM) were soldered on end, two per contact point. The pass-throughs were made from 0 ohm resistors (Vishay Intertechnology, Inc., Malvern, Pennsylvania). All components were in mini-MELF format. The assembly was run through a reflow oven to finish bonding the spheres and components to the pads on both sides of the board. The top side of the board was equipped with an emitting diode (LED) and a pair of contacts for sampling the rectified voltage, with a via providing a test point for each pass-through signal.

Contact spacing in the exemplary contact array was 4 mm. The power electrodes were 3 mm in width with a gap of 2 mm between electrodes. The embroidered pattern of the fabric in contact with the array was completed with conductive thread array (silver-plated nylon thread). In simulated testing, the embroidered electrode pattern with the geometries described above was supplied with 0 and 5V. Tests were carried out by lifting and placing the device at a new position. The red LED indicated a successful circuit with no open-circuit errors in 100 different placements with the array horizontal and 5 errors in 100 placements at 45 degrees.

Here, an e-textile circuit made from woven strips of conductive fabric was driven with 5V via contact with the 7×7 array. Illumination of the LED, while the contact array rested on the two active traces of the conductive fabric, demonstrated providing power extraction to a soft circuit.

To validate these findings related to power collection, a function generator, outputting a sine wave, was connected to the pass-through resistor on a pin that was not contacting 5V potential or a grounded electrode. This setup represented a pin touching a signal trace. The output was compared to the original sine wave signal on an oscilloscope, showing results consistent with power being extracted to the soft circuit.

Example 2

It will be appreciated that interdigitated positive and negative electrode arrays can be described using only two parameters: the electrode width and the electrode gap. Accordingly, an interdigitated electrode surface was used to simulate the number of contacts over a continuous range of electrode widths, and gaps, in units of contact pin spacing, in order to determine the sufficiency of the contact array to extract and distribute power (or transmit signals) even while its positioning changes relative to the underlying circuit. The results of the simulation are shown graphically in FIG. 5, with additional results provided in the outer images shown in FIG. 6.

For simulating rotation, the electrodes and contact array underwent computer-simulation modeling for angles between 0 and 90 degrees, and center position ranging from the center of one electrode, to the center of the neighboring gap. Because of symmetry for a 7×7 array, this range covers all possible array positions with respect to the electrode pattern. In the simulation, computer code translated and rotated the 7×7 array over the interdigitated electrode pattern, keeping track of the lowest number of pins touching the positive and the negative net (whichever was least) during all the positions and orientations. In the interdigitated pattern, a net consists of every other electrode, denoted in FIG. 5 as the "A" or the "B" net.

The "scores" represented in FIG. 6 are the least number of pins contacting either of the two nets at all positions. If, at any position, a configuration was found that made no contact to either one of the nets, that electrode width/gap combination received a score of 0. The graph of FIG. 5 (center image in FIG. 6) shows a complex boundary to the "safe" zone of electrode configurations that provide more than one or two contacts at the worst case position. However, there is a solid zone of higher numbers (more reliable contact) as the electrode gap is made smaller and as the electrodes are made wider than one pin-spacing unit. The black dot best seen in FIG. 6 marks the configuration used in experiments on an embroidered interdigitated circuit.

Interdigitated electrode patterns at the lower left corner of the contiguous safe zone (for example, a relative width of 1 and electrode gap of 0.1) should be able to stretch with respect to the pin spacing and still power the onboard circuit at any orientation, as long as the growing widths and gaps do not cross into the red zone in the graph of FIG. 5. The dimensions of the array and contacts present differing parameters as shown by the materials as listed in Table 2. The first row under the headings is for the demonstration device, and the bottom row is for a potentially smaller system adaptable to curved surfaces, a PCB surface with a ball grid array (BGA) device.

TABLE 2

Limits on device dimensions in two materials systems

| System | Maximum pin width | Minimum electrode gap | Minimum pin spacing |
| --- | --- | --- | --- |
| E-textile/PCB | 1 mm spring pin diameter | ~1.5 mm | ~2 mm |
| PCB/BGA | 0.3 mm | ~0.5 mm | ~0.6 mm |

The interdigitated electrodes performed nearly without errors as expected based on their location on FIG. 6 (center portion, corresponding with FIG. 5 graph, black dot). At 45 degrees, the few errors were connected to the underlying electrodes having a slight saddle shape, leading to non-contact of the diagonal rows at some positions. This problem may be remedied by using spring contacts or by making the array from conformal materials. In view of the above descriptions, it will be appreciated that closely-spaced electrodes like those in the top left of FIG. 5 provide the greatest assurance that the circuit will find power. However, a larger electrode gap creates space in the layout for other electrodes that carry signals instead of power. Therefore, layouts like the one in the lower right of FIG. 5 may be preferable for some self-configuring applications that undergo changes in positioning, such as occurs with a garment being worn or when a sensor is repositioned, and which need to communicate over the surface. Of course, a larger array than the 7×7 array described here would provide a path to more complex underlying circuits. In this regard, even the worst case at the top right of the graph, with its large electrode gaps, would consistently touch both power nets and provide power if it were a 10×10 instead of 7×7 array. While a larger device area is part of the balance that must be reached in that it has potential drawbacks for miniaturization, the prospect exists to push the viable area of the plot in FIG. 5 out to larger-sized electrode gaps, thus making room for sensor communication lines.

Example 3

Following is a specific fabrication example in agreement with FIGS. 11A to 11F, described generally above. A 400 nm thick thermal oxide was grown on silicon wafers by wet oxidation in a tube furnace at 1000 C. Standard photolithography and etching were used to pattern Cr metal into the predetermined designs. To produce the metal thickness and stress values in Table 1, a sputtering machine (Lesker PVD75) was used to sputter coat the wafers from a Cr target using 300 W DC power, 5 mTorr argon pressure and 15-18 minutes of deposition time. By depositing metal at below 200 C on a silicon dioxide ($SiO_2$) layer grown at 1000 C, strain mismatched bimorphs were created. The oxide was removed by plasma etching everywhere except where it was protected by the metal pattern. For achieving this, wafer dices were processed in a March plasma etcher for 10 minutes with 240 mTorr pressure of CF4:H2 at a partial pressure ratio of 60:40 and a RF power of 260 W.

Fabrics (Matte Tulle Fuschia 100% nylon, Casa Collection Chiffon Chocolate 100% polyester, Glitterbug Micronet Fabric White 100% nylon, Jo Ann Fabrics) were attached tightly over the surface, then the structures were released using a $XeF_2$ etch chamber (Xactix, Inc.) to undercut them from the wafer by a 10 micron deep isotropic silicon etch. For grippers with arm widths in the range of 15 microns, the etch process required 30 or more 30 s cycles of exposure to an atmosphere of 3 Torr $XeF_2$ for complete release. The upper metal film constrains the expansion of the lower SiO2 layer; thus when released from the substrate, the bilayer curls with a radius of curvature that minimizes its potential energy.

The present example used radial arrays of gripper arms with lengths in the 200 micron range. Other curvature radii possible include 60-100 microns.

Scanning electron microscopy and optical microscopy were used to evaluate the radius of curvature, as well as whether MEMS devices could realistically be moved from silicon wafers to fabrics using the strain energy based "pop-up" process. Film stress was measured on 4-inch diameter wafers using a Toho film stress monitor. The properties in Table 1 (a 400 nm oxide, and a 130 nm thick Cr layer) produced structures with a radius of curvature ranging from 100 to 193 microns, for an average of 144±41 microns based on measurements from 6 structures. For the fabric transfer process, imperfections included missed connections, too-short grippers, and crushing of grippers by misaligned fabric. Successes showed that the fabric is neither visibly damaged nor does the fabric interfere with MEMS processing (FIGS. 14A to 14D).

The embodiments described herein are non-limiting and are meant to be exemplary. Accordingly, it will be understood that the embodiments described herein are not limited in their application to the details of the teachings and descriptions set forth, or as illustrated in the accompanying figures. Rather, it will be understood that the present embodiments and alternatives, as described and claimed herein, are capable of being practiced or carried out in various ways. Also, it is to be understood that words and phrases used herein are for the purpose of description and should not be regarded as limiting. The use herein of such words and phrases as "such as," "comprising," "e.g.," "containing," or "having" and variations of those words is meant to encompass the items listed thereafter, and equivalents of those, as well as additional items. The use of "including" (or, "include," etc.) should be interpreted as "including but not limited to."

All descriptions herein, including those incorporated by reference, are meant to illustrate, rather than to serve as limits on the scope of what has been disclosed herein. It will be understood by those having ordinary skill in the art that modifications and variations of these embodiments are reasonably possible in light of the above teachings and descriptions.

I claim:

1. An electrical contact array for harvesting power from a power circuit, comprising
    a plurality of external electrical contacts configured with redundancy such that the electrical contact array is capable of harvesting power from the power circuit when only some of the external electrical contacts make an electrical connection with the power circuit while some others of the external electrical contacts do not contact any power circuit, wherein the external electrical contacts are electrically exposed to an external environment of the electrical contact array;
    a plurality of power collection diodes or transistors, at least one per external contact, configured to extract power from the power circuit;
    signal pass-throughs;
    a power output configured to output maximum and minimum voltages to which the external electrical contacts are exposed;
    a mesh; and
    electrically conductive grippers configured to bring electronic contacts from one side of the mesh to another side of the mesh.

2. The electrical contact array of claim 1, further comprising at least two diodes per contact that produce a rectified power signal when the contact is exposed to an external voltage trace.

3. The electrical contact array of claim 1, made from thin film semiconductors.

4. The electrical contact array of claim 1, wherein the electrical contact array is rigid.

5. The electrical contact array of claim 1, wherein the electrical contact array is flexible.

6. The electrical contact array of claim 1, wherein the external electrical contacts are spring contacts.

7. The electrical contact array of claim 1, wherein the electrical contact array is part of a human computer interaction (HCI) device.

8. The electrical contact array of claim 1, wherein the electrically conductive grippers are arranged as arrays of redundant grippers.

9. The electrical contact array of claim 1, further comprising fabric carriers, wherein the plurality of external electrical contacts comprise micromechanical grippers mechanically entangled with the fabric carriers.

10. The electrical contact array of claim 1, wherein the electrical contact array is configured to be exposed to a voltage of 5V.

11. The electrical contact array of claim 5, wherein the electrical contact array is stretchable.

12. The electrical contact array of claim 9, wherein the micromechanical grippers each comprise a thin film strain-mismatched bilayer.

13. The electrical contact array of claim 11, wherein the electrical contact array is conformal.

14. An electrical contact array for harvesting power from a power circuit, comprising
   a plurality of external electrical contacts configured with redundancy such that the electrical contact array is capable of harvesting power from the power circuit when only some of the external electrical contacts make an electrical connection with the power circuit while some others of the external electrical contacts do not contact any power circuit, wherein the external electrical contacts are electrically exposed to an external environment of the electrical contact array; and
   a plurality of power collection diodes or transistors, at least one per external contact, configured to extract power from the power circuit;
   a mesh; and
   electrically conductive grippers configured to bring electronic contacts from one side of the mesh to another side of the mesh.

15. The electrical contact array of claim 14, further comprising
   signal pass-throughs; and
   a power output configured to output voltages.

* * * * *